United States Patent

Cucchi et al.

Patent Number: 5,815,207
Date of Patent: Sep. 29, 1998

[54] DIFFERENTIAL CODING AND DECODING METHOD AND RELATED CIRCUITS

[75] Inventors: Silvio Cucchi, Gaggiano; Maurizio Lazzer, Zoppola, both of Italy

[73] Assignee: Alcatel N.V., Rijswijk, Netherlands

[21] Appl. No.: 537,796

[22] PCT Filed: Apr. 29, 1994

[86] PCT No.: PCT/EP94/01360

§ 371 Date: Dec. 27, 1995

§ 102(e) Date: Dec. 27, 1995

[87] PCT Pub. No.: WO94/26068

PCT Pub. Date: Nov. 10, 1994

[30] Foreign Application Priority Data

Apr. 29, 1993 [IT] Italy ................................. MI93A0844

[51] Int. Cl.⁶ .............................................. H04N 7/30
[52] U.S. Cl. ..................... 348/403; 348/409; 348/420
[58] Field of Search .................... 348/384, 390, 348/400–403, 405, 409–413, 415, 416, 420, 699; 382/232, 236, 238, 248, 250; H04N 7/133

[56] References Cited

U.S. PATENT DOCUMENTS

| 4,200,886 | 4/1980 | Musmann et al. | 348/409 |
| 4,292,651 | 9/1981 | Kretz et al. | 348/409 |
| 4,837,618 | 6/1989 | Hatori et al. | 348/401 |
| 5,001,559 | 3/1991 | Gonzales et al. | 348/400 |
| 5,237,410 | 8/1993 | Inoue | 348/409 |
| 5,418,617 | 5/1995 | Naimpally et al. | 348/416 |
| 5,526,052 | 6/1996 | Ar | 348/405 |

FOREIGN PATENT DOCUMENTS 1041386  2/1989  Japan.

OTHER PUBLICATIONS

Ericsson, "Fixed and Adaptive Predictors for Hybrid Predictive/Transform Coding", IEEE Transactions of Communications, vol. Com–33, No. 12, pp. 1291–1302, Dec. 1985.

Musmann et al, "Advances in Picture Coding", Proceedings of the IEEE, vol. 73, No. 4, pp. 523–548, Apr. 1985.

Izawa et al, "Improvement of Picture Quality and Coding Efficiency Using Discrete Cosine Transform", Electronics and Communications in Japan, Part 1, vol. 73, No. 6, pp. 12–21, 1990.

Pratt, "Digital Point Processing Image Coding", pp. 640–645, 1978.

Primary Examiner—Richard Lee
Attorney, Agent, or Firm—Ware, Fressola, Van Der Sluys & Adolphson LLP; Milton Oliver

[57] ABSTRACT

A method for the differential coding and decoding and related circuits wherein the differential coding is a special type of coding which, instead of coding directly an input signal, carries out the difference between this signal and a predicted signal of it. This allows the reduction of the information to be transmitted. The method is capable of further reducing the signal redundancy and therefore the information to be transmitted.

8 Claims, 1 Drawing Sheet

DIFFERENTIAL CODING AND DECODING METHOD AND RELATED CIRCUITS

TECHNICAL FIELD

The present invention relates to a method and circuits for differential coding and decoding.

BACKGROUND OF THE INVENTION

A method normally used for reducing the information to be transmitted is to carry out the difference between the signal in transit and its predicted one.

At this point the problem arises in that if the input signal is confined within a certain range of values, then the signal, obtained by carrying out the difference between input signal and predicted signal, has a double range.

Simple algorithms, capable of maintaining the differential signal within the range of the original signal, are known.

SUMMARY OF THE INVENTION

It is an object of the present invention to provide a method of differential coding and decoding which is capable of efficiently reducing the redundancy of the information to be transmitted.

In accordance with the invention the coding method is a method for coding a video signal comprising the steps of considering blocks of X rows and Y columns of said video signal, calculating the bidimensional Discrete Cosine Transform of said blocks, predicting the transform coefficients of the first column of each transformed block, carrying out a difference between the true value of each of said transform coefficients and the predicted value of each of said transform coefficients if said true value is different from zero, and characterized by predicting said transform coefficients of the first column of each transformed block using coefficients of further columns of said transformed block and coefficients of a preceding transformed block, coding said difference by associating more probable difference values to smaller numbers, thereby maintaining said numbers within the initial range of said true value, and coding the true value of said transform coefficient as such if said true value is equal to 0.

A decoding circuit according to the invention comprises a circuit for coding a video signal comprising, means for considering blocks of X rows and Y columns of said video signal, means for calculating the bidimensional Discrete Cosine Transform of said blocks, means for predicting the transform coefficients of the first column of each transformed block, means for carrying out a difference between the true value of each of said transform coefficients and the predicted value of each of said transform coefficients if said true value is different from zero, characterized in that said means for predicting the transform coefficients of the first column of each transformed block uses coefficients of further columns of said transformed block and coefficients of a preceding transformed block, and said circuit further comprises means for coding said difference by associating more probable difference values to smaller numbers, thereby maintaining said numbers within the initial range of said true value, and means for coding the true value of said transform coefficient as such if said true value is equal to 0.

BRIEF DESCRIPTION OF THE DRAWING

The FIGURE is a block diagram of a circuit for coding/decoding signal according to the present invention.

BEST MODE FOR CARRYING OUT THE INVENTION

Figure 1:
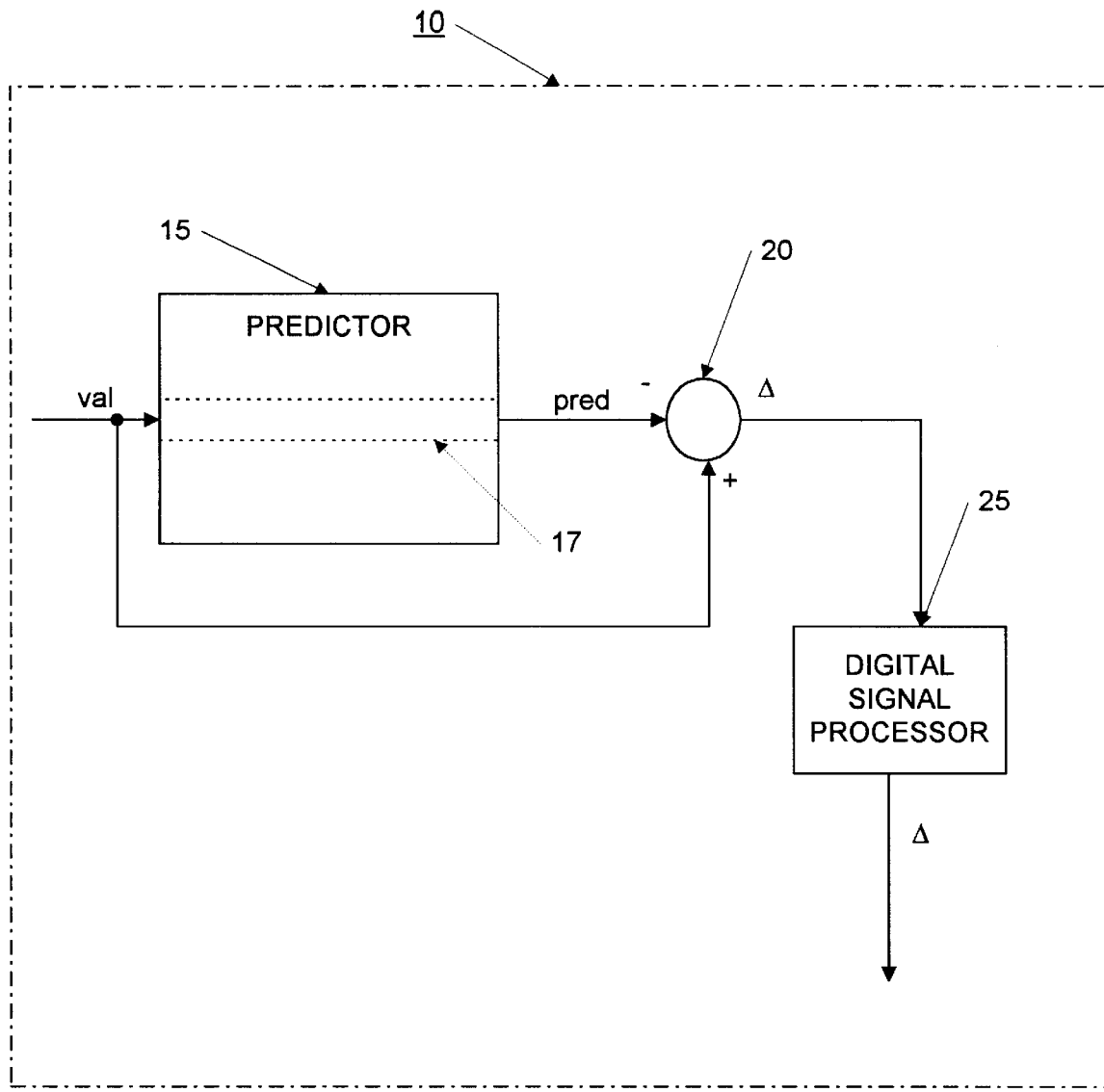

The invention will become more intelligible from the following description.

The differential coding is a special type of coding which, instead of coding directly an input signal, carries out the difference between this signal and a predicted signal of it. For the prediction of the input signal it is possible to use any type of predictor; in the simplest case the value encoded previously can be used as the prediction signal.

Assuming that the input signal values are comprised in the set (−range . . . , range −1), range being a positive integer, it results that the difference between this signal and its predicted one has a double range.

Therefore, the problems arises as to how the differential signal can be led within the original range.

The algorithm herein set forth is known from the literature and is the simplest method for maintaining the differential signal within the original range signal. Let:

val be the value of the sample to be predicted pred be the prediction value.

The algorithm is the following:

$$\Delta = \text{val} - \text{pred}; \quad (1)$$

$$\text{if } (\Delta < -\text{range}) \; \Delta = \Delta + 2 \text{ range};$$

$$\text{else if } (\Delta > \text{range} - 1) \; \Delta = \Delta - 2 \text{ range};$$

In an embodiment thereof, the invention, besides maintaining the values of the differential signal within the original range, carries out a further compression thereof. The underlying idea is that, given the predicted signal, the difference values are allocated in such a way as to have the smaller values as close as possible to the prediction value. In this manner, more probable values are assigned smaller numbers.

The algorithm is the following:

$$\Delta = \text{val} - \text{pred}; \quad (2)$$

$$\text{range}_\Delta = \text{range};$$

$$\text{if } (\text{pred} > 0) \; \text{range}_\Delta = \text{range} - \text{pred} - 1;$$

$$\text{else if } (\text{pred} < 0) \; \text{range}_\Delta = \text{range} + \text{pred};$$

$$\text{if } (|\Delta| > \text{range}_\Delta)$$

$$\quad \text{if } ((|\Delta| - \text{range}_\Delta + 1) \bmod 2 == 0) \; \text{sn} = -1;$$

$$\quad \text{else if } ((|\Delta| \; \text{range}_\Delta + 1) \bmod 2 == 1) \; \text{sn} = +1;$$

$$\Delta = (\text{range}_\Delta + (|\Delta| - \text{range}_\Delta + 1)/2) \; \text{sn};$$

When the input signal is zero for a great number of times, the difference operation with the previous one tends to eliminate some of the zeroes which are present.

It is convenient to maintain the sequences of zeroes, since in an eventual subsequent compression of information, they can be encoded in a very effective manner.

In another embodiment of the invention, by carrying out an absolute coding of the signal when its value is zero, the number of zeroes remain unchanged even working on differential.

The algorithm is the following:

$$\text{if } (\text{val} == 0) \; \Delta = 0; \quad (3)$$

$$\text{else if } (\text{pred} == 0) \; \Delta = \text{val};$$

$$\text{else if } (\text{pred} > 0)$$

-continued $\Delta$ = val – pred;

if (($\Delta \geq 0$)    ($\Delta < -$ pred)) $\Delta = \Delta + 1$;

else if (pred < 0)

$\Delta$ = val – pred;

if (($\Delta \leq 0$)    ($\Delta > -$ pred)) $\Delta = \Delta - 1$;

No control on differential signal range has been introduced here; however the techniques of the algorithms described previously can be extended thereto.

An application to video signal of the above-mentioned method will now be described.

The fundamental block of the system is the predictor that allows the variation range of the higher energy transformed coefficients to be reduced The differential signal which is transmitted has a statistic feature that is very convenient for a subsequent coding.

The method is applied for the coding of the video image components, luminance and chrominance, in which one resorts to DCT (Discrete Cosine Transform). A digital image is composed of a number of lines and each line is formed by a number of dots commonly referred to as "pixels".

The video coding technique to which reference is made herein, carries out a decomposition of the image into blocks of 8×8 pixels and then it applies the bidimensional DCT to each block. Such operation allows the spatial redundancy of the pixels in each block to be reduced.

At this point the DCT coefficients inside each block are uncorrelated to each other; it remains to be seen the residual correlation between adjacent blocks.

In the method of the invention, blocks along the strips of the image are considered. In particular the first block of each strip is transmitted without any processing, starting from the next one the method of the invention is applied in order to reduce the values of the higher weight coefficients.

The algorithm considers only the coefficients of the first column of each transformed 8×8 block; such coefficients generally are those of higher weight since they represent the vertical frequencies that, in an interlaced scanning, are the most important ones.

Therefore, just as one is processing the present block, he knows all the preceding block and all the coefficients of the present block with the exception of those of the first column, that are to be estimated.

The method consists in linking up the waveform (in the space domain) to the border between the present block and the preceding one.

To do so the preceding block is antitransformed by columns and the last column is determined; also the present block is anti-transformed by columns to determine the first column, but in this circumstance the DCT coefficients of the first column are not known and therefore appear as unknowns in the antitransform.

At this point the continuity between the two blocks is imposed by linking up the two columns at the common border (in the space domain).

From the system so obtained the unknown terms of the first column are obtained.

All this procedure consists merely in the following calculation:

$$PR_{x0} = C_{x0}^{pre} - C_{x1}^{pre} - C_{x1}^{att} + C_{x2}^{pre} - C_{x2}^{att} - C_{x3}^{pre} - C_{x3}^{att} + \quad (4)$$
$$C_{x4}^{pre} - C_{x4}^{att} - C_{x5}^{pre} - C_{x5}^{att} + C_{x6}^{pre} - C_{x6}^{att} - C_{x7}^{pre} - C_{x7}^{att}$$
$$x = 0, \ldots, 7$$

where:

$PR_{x0}$ is the predicted value of the DCT coefficients with index x0 of the present block, $C_{xy}^{pre}$ is the DCT coefficient with index x, y of the preceding block;

$C_{xy}^{att}$ is the DCT coefficient with index x, y of the present block.

The prediction thus obtained is subtracted from the true value and the difference is transmitted.

It is to be noted that the value estimated through the fore-going formula could also assume values which are out of the allowed range; in this circumstance a saturation at the closest end is merely carried out.

The next step consists in introducing suitable weight coefficients for each pair of homologous coefficients. In this manner it is considered that it is not correct to link up the columns at the borders, particularly if the image varies too much from one block to another. Such correction is indispensable especially for higher order coefficients.

In this case the formula becomes:

$$PR_{x0} = K_0 C_{x0}^{pre} - K_1(C_{x1}^{pre} + C_{x1}^{att}) + K_2(C_{x2}^{pre} - C_{x2}^{att}) - k_3(C_{x3}^{pre} + C_{x3}^{att}) + \quad (5)$$
$$K_4(C_{x4}^{pre} - C_{x4}^{att}) - k_5(C_{x5}^{pre} + C_{x5}^{att}) + K_6(C_{x6}^{pre} - C_{x6}^{att}) - K_7(C_{x7}^{pre} + C_{x7}^{att})$$
$$x = 0, \ldots, 7$$

where:

$K_x$=weight coefficient.

From simulations carried out it has been found that the performances of the system are not very sensitive to variation of weight coefficients, whereby they have been chosen all equal and with values given by sums of base two powers in order to simplify the relative hardware.

In this circumstance the estimated value in general occupies a number of bits greater than the allowed one, a simple uniform quantization with saturation leads the signal again in the correct range.

The prediction value is subtracted from the true value by following two different algorithms, one if the DCT coefficient has a 00 index and one for the other coefficients.

When DCT coefficient's index is 00, the first described algorithm is used, which allows the prediction error range to be reduced. In fact, such coefficient has a quasi-uniform probability distribution; the difference operation with the predicted one transforms such distribution into a Laplace distribution which is much more convenient for a successive coding.

For the other coefficients to be predicted, since they are zeroed for a great number of times, the algorithm of the differential with keeping of zeroes is used.

In case of higher order coefficients, the prediction so carried out does not allow the achievement of a significant compression of the signal; in such circumstance the coefficient is transmitted without any processing.

As far as the differential signal decoding is concerned, it is sufficient to carry out the inverse operations with respect to those described in the coding algorithms.

As seen in the FIGURE, the circuit 10 for implementing said methods in accordance with the invention at least comprises a predictor 15, an summer 20 and means 25 capable of carrying out calculations like, e.g., a digital signal processor (DSP). The DSP performs the algorithm for determining the Final Δ such as defined above by equation (2) or (3). For the application of the invention to video signals, the DCT coefficients are determined by the algorithm of equations (4) or (5).

In the simplest case, the predictor can be represented like a delay line 17 (shown in phantom) that outputs the value transmitted previously. Obviously several variations of the methods and circuits as described above are possible all falling anyway within the scope of the present invention.

We claim:

1. A method for coding a video signal comprising the steps of:
    considering blocks of X rows and Y columns of said video signal;
    calculating the bidimensional Discrete Cosine Transform of said blocks;
    predicting the transform coefficients of the first column of each transformed block;
    carrying out a difference between the true value of each of said transform coefficients and the predicted value of each of said transform coefficients if said true value is different from zero; and characterised by
    predicting said transform coefficients of the first column of each transformed block using coefficients of further columns of said transformed block and coefficients of a preceding transformed block;
    coding said difference by associating more probable difference values to smaller numbers, thereby maintaining said numbers within the initial range of said true value; and
    coding the true value of said transform coefficient as such if said true value is equal to 0.

2. A method according to claim 1 characterized in that said predicted first column of each block is calculated by means of the following calculation:

$$PR_{x0} = K_0 C_{x0}^{pre} - K_1(C_{x1}^{pre} + C_{x1}^{att}) + K_2(C_{x2}^{pre} - C_{x2}^{att}) - K_3(C_{x3}^{pre} + C_{x3}^{att}) +$$
$$K_4(C_{x4}^{pre} - C_{x4}^{att}) - K_5(C_{x5}^{pre} + C_{x5}^{att}) + K_6(C_{x6}^{pre} - C_{x6}^{att}) - K_7(C_{x7}^{pre} + C_{x7}^{att})$$

where:
    $PR_{x0}$ is the predicted value of the DCT coefficients with index x,0 of the present block,
    $C_{xy}^{pre}$ is the DCT coefficient with index x,y of the preceding block, and
    $C_{xy}^{att}$ is the DCT coefficient with index x,y of the present block, and
    $K_x$ is a weight coefficient.

3. A method according to claim 1, characterized in that for the calculation of the predicted values, blocks of x rows and y columns of the video signal are considered; and the discrete cosine transform of said blocks is calculated.

4. A method according to claim 3, characterized in that only the first column coefficients of said blocks are considered.

5. A method according to claim 4, characterized in that the two columns at a common border in the space domain are linked together.

6. A method according to claim 5, characterized in that the linking of the two columns at the common border in the space domain is carried out by introducing suitable weight transform coefficients.

7. A coding circuit including a predictor, a subtracter circuit, a digital signal processor, an input signal, a predicted signal, the digital signal processor being applied to a video signal which is the difference between the input signal and the predicted signal, characterized in that said processor processes the signal by
    considering blocks of X rows and Y columns of said video signal;
    calculating the bidimensional Discrete Cosine Transform of said blocks;
    predicting the transform coefficients of the first column of each transformed block;
    carrying out a difference between the true value of each of said transform coefficients and the predicted value of each of said transform coefficients if said true value is different from zero; and characterised by
    predicting said transform coefficients of the first column of each transformed block using coefficients of further columns of said transformed block and coefficients of a preceding transformed block;
    coding said difference by associating more probable difference values to smaller numbers, thereby maintaining said numbers within the initial range of said true value; and
    coding the true value of said transform coefficient as such if said true value is equal to 0.

8. A circuit for coding a video signal comprising:
    means for considering blocks of X rows and Y columns of said video signal;
    means for calculating the bidimensional Discrete Cosine Transform of said blocks;
    means for predicting the transform coefficients of the first column of each transformed block;
    means for carrying out a difference between the true value of each of said transform coefficients and the predicted value of each of said transform coefficients if said true value is different from zero; characterised in that
    said means for predicting the transform coefficients of the first column of each transformed block uses coefficients of further columns of said transformed block and coefficients of a preceding transformed block; and said circuit further comprises
    means for coding said difference by associating more probable difference values to smaller numbers, thereby maintaining said numbers within the initial range of said true value; and
    means for coding the true value of said transform coefficient as such if said true value is equal to 0.

\* \* \* \* \*

UNITED STATES PATENT AND TRADEMARK OFFICE
CERTIFICATE OF CORRECTION

PATENT NO. : 5,815,207
DATED : Sep. 29, 1998
INVENTOR(S) : Cucchi et al.

It is certified that error appears in the above-identified patent and that said Letters Patent is hereby corrected as shown below:

In column 5, claim 2, after equation, --for $x = 0, \ldots, 7$-- should be inserted.

In column 5, lines 50-51 "x rows and y columns" should be --X rows and Y columns--.

Signed and Sealed this

Twentieth Day of April, 1999

Attest:

Q. TODD DICKINSON

*Attesting Officer*         *Acting Commissioner of Patents and Trademarks*